(12) United States Patent
Onuchin et al.

(10) Patent No.: US 11,397,374 B2
(45) Date of Patent: *Jul. 26, 2022

(54) COOLING SYSTEM FOR A 360 DEGREE CAMERA

(71) Applicants: Ivan Onuchin, Parkland, FL (US); Dmitry Kozko, Sunny Isles Beach, FL (US); Nikolay Shturkin, Yekaterinburg (RU)

(72) Inventors: Ivan Onuchin, Parkland, FL (US); Dmitry Kozko, Sunny Isles Beach, FL (US); Nikolay Shturkin, Yekaterinburg (RU)

( * ) Notice: Subject to any disclaimer, the term of this patent is extended or adjusted under 35 U.S.C. 154(b) by 0 days.

This patent is subject to a terminal disclaimer.

(21) Appl. No.: 17/026,293

(22) Filed: Sep. 20, 2020

(65) Prior Publication Data
US 2021/0278750 A1 Sep. 9, 2021

Related U.S. Application Data

(63) Continuation-in-part of application No. 15/530,549, filed on Jan. 27, 2017, now Pat. No. 10,812,754.

(51) Int. Cl.
*G03B 17/55* (2021.01)
*G03B 17/02* (2021.01)
*H05K 7/20* (2006.01)
*H04N 5/225* (2006.01)
*H04N 5/232* (2006.01)
*H04N 5/76* (2006.01)

(52) U.S. Cl.
CPC ............. *G03B 17/55* (2013.01); *G03B 17/02* (2013.01); *H04N 5/2252* (2013.01); *H04N 5/22521* (2018.08); *H04N 5/23238* (2013.01); *H04N 5/76* (2013.01); *H05K 7/2039* (2013.01)

(58) Field of Classification Search
CPC ............. H05K 7/2039; H05K 7/20145; H04N 5/23238; H04N 5/2252; H04N 5/772
See application file for complete search history.

(56) References Cited

U.S. PATENT DOCUMENTS

| | | | | |
|---|---|---|---|---|
| 2009/0213543 | A1* | 8/2009 | Nemoz | H05K 7/20563 361/694 |
| 2012/0242837 | A1* | 9/2012 | Sasagawa | H04N 5/2258 348/159 |
| 2017/0112418 | A1* | 4/2017 | Comeau | A61B 5/749 |

* cited by examiner

*Primary Examiner* — Yogesh K Aggarwal
(74) *Attorney, Agent, or Firm* — Dan De La Rosa

(57) ABSTRACT

A 360 degree camera device that has a housing and cooling mechanism which manages heat created by the devices components and allows the device to continuously run for at least 24 hours.

23 Claims, 2 Drawing Sheets

COOLING SYSTEM FOR A 360 DEGREE CAMERA

RELATED APPLICATION

This application is a continuation-in-part of U.S. application Ser. No. 15/530,549 filed on Jan. 17, 2017 entitled "COOLING SYSTEM FOR A 360 DEGREE CAMERA".

TECHNICAL FIELD

Embodiments of the present disclosure relate to the field of 360 degree camera devices and, more particularly, to a 360 degree camera that is constructed to allow the camera to continuously run twenty four hours a day, seven days a week by maintaining an optimum internal running environment.

BACKGROUND

The present invention relates to the panoramic optical device and, more particularly, to a panoramic optical device using a two lens array with lenses facing substantially opposing directions.

Providing quality optics in a panoramic camera is challenging. Different approaches have been taken for this problem. One approach is to move a lens and to capture a set of images as the lens moves, which cover a field of view over time. The images from the moved lens are combined to form a panoramic scene. Another is to use a panoramic optical device to create a 360 degree horizontal field of view using a single shot (a discrete point of time using a single lens). This later approach is sometimes referred to as a "one-shot" panoramic device, which captures a panoramic scene in a single point in time using a single lens. Still another is to utilize an ultra-wide angle lens (e.g., a fish-eye lens) to capture a scene with a wider-than-normal field of view. Yet another approach is to form an array of multiple different camera lenses and to combine the image results captured by the array of lenses into a single image. Each of these approaches has benefits and drawbacks depending on use cases.

Panoramic devices that utilize an array of lenses typically use four or more lenses positioned to face different cardinal directions from each other. Each of the lenses may have a field of view that overlaps with a field of view of two or more of the other lenses. The more lenses that are used in the array, the greater the manufacturing cost. Further, the more lenses used, the more overlapping fields. Each overlap requires processing to stitch or smooth together images captured by other ones of the lenses. Additional processing is needed to correct color, shading, and lighting deltas captured by different ones of the lenses. Each processing operation can result in deviations from a true image, and can be costly in terms of processing cycles. When real-time images or near real time images are desired, costly processors (in terms of bill of material prices and power consumption) are necessary, where the cost increases geometrically with increases in a number of used lenses in the array.

Three hundred sixty (360) degree camera devices can be used for a variety of commercial and domestic purposes. A common problem with all digital cameras is that they over heat after a certain amount of time and either shut down, malfunction, or completely cease functioning due to damage. The embodiments of the 360 degree camera enclosed in this application are capable of constantly running and operating in various light conditions for domestic application. The embodiments enclosed herein seek to solve this problem and provide for a 360 degree camera that provides for optimal heat management to allow the device to be constantly used.

SUMMARY OF THE INVENTION

In one embodiment, a recording device having a heat management system, the system comprises a housing comprising an exterior surface and an internal space, the exterior surface forming an outer shell of the device, the outer shell having top and bottom ends, the internal space is designed to contain components of the device, at least one chassis having at least a portion of the chassis is enclosed by the outer shell, at least a portion of the chassis surrounds at least a portion of the internal space of the housing; when the device is in use, the components of the device create heat, the chassis absorbs the heat and creates a convention effect which draws cool air through the second opening at the bottom end of the outer shell, the drawing of cool air creates airflow through the bottom end of the outer shell, and causes hot air to exit through the first opening at the top end of the outer shell thereby cooling the device and its components, and preventing overheating of the device, the chassis conducts heat away from said components of said device allowing said device to maintain a constant optimal internal operating temperature.

In a further embodiment, said chassis of said device uses radiation to dissipate heat. In another embodiment, the device is a camera. In yet another embodiment, the device is a 360 degree camera. In still a further embodiment, the device is a continuous video, photo, audio and infrared recording and playing device. In still another embodiment, said device is capable of continuously recording audio, video, photos, and infrared in all types of light.

In a yet another embodiment, the chassis has at least one air duct. In still a further embodiment, the air duct is located on a front side of the chassis. In yet another embodiment, the air duct is located on a back side of the chassis. In still yet another embodiment, the device comprises components, the components are selected from a group comprising lens, sensors, and processors.

In still a further embodiment, the device comprises at least two lenses, at least one sensor and at least one processor.

In yet a further embodiment, the chassis comprises a surface area, the surface area of the chassis has multi-level surfaces creating ridges and gaps which create a maximum amount of the surface area, the maximum amount of the surface area allow the chassis to absorb a maximum amount of heat.

In still another embodiment, the chassis is situated adjacent the second opening at the bottom end of the outer shell of the device.

In still a further embodiment, the camera modules comprise at least one sensor and at least two lens, the lens can be fish eye lens with field of view more than 180 degrees, the camera modules can be positioned back to back.

In yet another embodiment, the camera modules have an optical axis that is displaced relatively to each other to create a parallel shift. In still another embodiment, the optical axis of the camera module may not be parallel. In a further embodiment, the camera module at least one mirror to project a video from the lenses on to a single image sensor.

A camera device having a cooling system, the camera comprises at least two lenses, at least one sensor and at least one processor, a housing comprising an exterior surface and an internal space, the exterior surface forming an outer shell of the device, the outer shell having top and bottom ends, the internal space is designed to contain the lenses, the sensor and the processor of the device, the outer shell comprises at least two openings, a first opening at the top end and a second opening at the bottom end of the outer shell, at least one chassis having at least one air duct, at least a portion of the chassis is enclosed by the outer shell, at least a portion of the chassis surrounds at least a portion of the internal space of the housing, and when the device is in use, the components of the device create heat, the chassis absorbs the heat and creates a convention effect which draws cool air through the second opening at the bottom end of the outer shell and the air ducts of the chassis, the drawing of cool air creates airflow through the bottom end of the outer shell and the air ducts of the chassis, and causes hot air to exit through the first opening at the top end of the outer shell thereby cooling the device and preventing overheating of the device.

In still a further embodiment, a camera device having a cooling system, the camera comprises at least two lenses, at least one sensor and at least one processor, a housing comprising an exterior surface and an internal space, the exterior surface forming an outer shell of the device, the outer shell having top and bottom ends, the internal space is designed to contain the lenses, the sensor and the processor of the device, at least one chassis, at least a portion of the chassis is enclosed by the outer shell, at least a portion of the chassis surrounds at least a portion of the internal space of the housing; when the device is in use, the components of the device create heat, the chassis absorbs the heat and creates a convention effect which creates air flow which cools the device and prevents overheating of the device, and the chassis conducts heat away from the components of the device allowing the device to maintain a constant optimal internal operating temperature.

In still yet another embodiment, a method of cooling a recording device, the method comprising providing a housing comprising an exterior surface and an internal space, the exterior surface forming an outer shell of the device, the outer shell having top and bottom ends, the internal space is designed to contain components of the device, providing at least one chassis having at least one air duct, at least a portion of the chassis is enclosed by said outer shell, at least a portion of the chassis surrounds at least a portion of the internal space of the housing, when the device is in use, the components of the device create heat, the chassis absorbs the heat, and creating a convention effect which draws cool air through the air ducts of the chassis, the drawing of cool air creates airflow through the air ducts of said chassis, and causes hot air to exit through the air ducts thereby cooling said device and its components, and preventing overheating of said device.

In a further embodiment, the present invention provides for a recording device having a cooling system, the cooling system comprises: a housing comprising an exterior surface and an internal space, the exterior surface forming an outer shell of the device, the outer shell having top and bottom ends, the internal space is designed to contain components of the device; and at least one chassis, at least a portion of said chassis is enclosed by the outer shell and is situated within at least a portion of the internal space of the housing; when the device is in use, the components of the device create heat, the chassis absorbs the heat and creates a convention effect which draws cool air from the bottom end of said outer shell, the drawing of cool air creates airflow throughout the internal space thereby cooling the device and its components, and preventing overheating of the device, the chassis conducts heat away from the components of the device allowing the device to maintain a constant optimal internal operating temperature.

In another further embodiment, the present invention also provides for a method of cooling a recording device, the method comprising: providing a housing comprising an exterior surface and an internal space, the exterior surface forming an outer shell of the device, the outer shell having top and bottom ends, the internal space is designed to contain components of the device, providing at least one chassis having at least one air duct, at least a portion of the chassis is enclosed by the outer shell and is situated within at least a portion of the internal space of the housing; when the device is in use, the components of the device create heat, the chassis absorbs the heat; and creating a convention effect which draws cool air through the air ducts of the chassis, the drawing of cool air creates airflow, and causes hot air to exit through the air ducts thereby cooling the device and its components, and preventing overheating of the device.

In yet another further embodiment, the method further comprises providing at least two openings on the outer shell, a first opening at the top end and a second opening at the bottom end of the outer shell. In still another further embodiment, the method further comprises drawing cool air from the second opening at the bottom end of the outer shell and causing hot air to exit through the first opening at the top end of the outer shell.

BRIEF DESCRIPTION OF THE DRAWINGS

The accompanying drawings are included to provide a further understanding of the present invention. These drawings are incorporated in and constitute a part of this specification, illustrate one or more embodiments of the present invention and together with the description, serve to explain the principles of the present invention.

Figure 1:
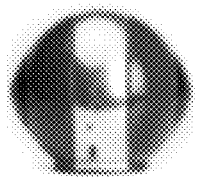
FIG. 1 shows a spherical configuration having a solid central ring sandwiched between parallel hemispheres, which have a lens at their apex in accordance with embodiments of the disclosure.

Among those benefits and improvements that have been disclosed, other objects and advantages of this invention will become apparent from the following description taken in conjunction with the accompanying drawings. The drawings constitute a part of this specification and include exemplary embodiments of the present invention and illustrate various objects and features thereof.

DETAILED DESCRIPTION OF THE INVENTION

As required, detailed embodiments of the present invention are disclosed herein; however, it is to be understood that the disclosed embodiments are merely exemplary of the invention that may be embodied in various forms. The figures are not necessarily to scale, some features may be exaggerated to show details of particular components. Therefore, specific structural and functional details disclosed herein are not to be interpreted as limiting, but merely as a basis for the claims and as a representative basis for teaching one skilled in the art to variously employ the present invention.

One aspect of the disclosure describes a panoramic optical camera or optical capture device that has a casing and two ultra-wide angle lenses facing substantially opposing directions. A field of view of each of the lenses is greater than one hundred and eighty degrees. The casing for the image capture device positions the lenses such that an overlapping region of image capture exists for at least a two hundred and seventy degree vertical arc about the image capture device. The image capture device substantially provides a three hundred and sixty horizontal field of view and substantially provides at least a two hundred and seventy degree vertical field of view. The casing does not substantially block the field of view of either of the two ultra-wide angle lenses within at least a two hundred and seventy degree arc corresponding to the vertical field of view.

Another aspect of the disclosure describes an image capture device having two ultra-wide angle lenses and a casing. The two ultra-wide angle lenses face substantially opposing directions. A field of view of each of the lenses is greater than one hundred and eighty degrees. The outer surface of the image capture device has two curved and opposing endpoints, each of which house one of the two ultra-wide angle lenses. Cross sectional planes of the casing are parallel to each other and are orthogonal to a direction in which each of the two ultra-wide angle lenses face. The cross sectional planes are substantially ellipses or circles of increasing radius from each of the opposing endpoints. The cross sectional planes have a greatest radius at a distance approximately midway between the two ultra-wide angle lenses. Substantially refers to a deviation from an ideal of less than five percent negating any deviations in outer surface shape for support or mounting, wherein a portion of the outer surface shape negated if any is less than ten percent of the overall outer shape by surface area. Approximately in this context means within +/−ten percent of the midway point.

Another aspect of the disclosure describes an image capture device having two ultra-wide angle lenses and a casing. The two ultra-wide angle lenses face substantially opposing directions, wherein a field of view of each of the lenses is greater than one hundred and eighty degrees. A combined field of view of the two ultra-wide lenses is at least a three hundred and fifty degree arc (allowing for some line-of-sight blockage within a 10 degree arc) in a horizontal plane and at least a two hundred and seventy degree arch in a vertical plane. Each of the two ultra-wide angle lenses is separated by a linear width. The fields of views of the two ultra-wide angle lenses form a cross sectional, circular arc of at least two hundred and seventy degrees at a point of overlap having a radius from approximately a center of the image capture device referred to as a height. A conical volumetric blind spot region exists between the distance and the height. The casing for the image capture device secures the two ultra-wide angle lenses in a fixed position. A volumetric body of the casing is at least ninety-five percent within the conical volumetric blind spot region to ensure field of views of the two ultra-wide angle lenses are minimally impeded and are therefore able to overlap in the cross sectional circular arc of at least two hundred and seventy degrees.

The types of devices described above create heat and have the risk of overheating while the internal components, specifically the processor is running. In order to allow these devices to run and function as they are designed it is necessary to efficiently manage the heat and control the internal temperature of the device. If this is not accomplished the device will either shut down or be damaged. Thus, it is essential to find a way to manage the internal heat and temperature.

In addition, the specific embodiments disclosed herein, are design to operate constantly (i.e. twenty fours a day). In order to achieve this capability, the device requires an efficient and effective form of heat management. There are only three principles that can be applied for heat management convection, radiation, and conduction. Convection is means of heat management that relies on moving air over components to remove the heat away from the components. Radiation is the basic ability for something that is hot releases some of the heat from itself. Conduction is the ability to use one object or accessory to absorb the heat away from another object. The various embodiments disclosed herein, rely on convection, radiation, and conduction, and are explained below.

FIG. 1 shows a spherical configuration having a solid central ring sandwiched between parallel hemispheres, which have a lens at their apex. In one embodiment, the distance between lenses (e.g., width 132) compared to the height (e.g., height 130) of the device can be in accordance with approximately a 6 to 5 ratio. Hence, a device as shown in FIG. 3 could be 2.3 inches high and 2.7 inches long, for example.

Figure 2:
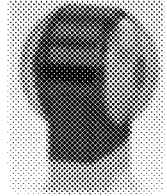
FIG. 2 shows a device having lenses protected by a transparent hemisphere in accordance with embodiments of the disclosure.

FIG. 2 shows a device having lenses protected by a transparent hemisphere. Use of the protective transparent substance may be challenging in high-glare situations, although optical filters and polarized lens may be used to minimize these challenges.

Figure 3:
FIG. 3 shows an ellipsoid shaped panoramic optical device having a substantially greater width than height in accordance with embodiments of the disclosure.

FIG. 3 shows another embodiment which is an ellipsoid shaped panoramic optical device having a greater width (e.g., width 132) than height (e.g., height 130), such as in accordance to a 2 to 1 ratio. One of ordinary skill can recognize from these examples, that numerous shapes are contemplated, which may depend on optical characteristics of the lenses used and on a form factor of the panoramic optical device.

An overall shape of the outer surface or body of the casing can be described in many ways using solid geometry conventions, where the shape may depend on a specific embodiment. For example, the overall shape can be that of a non-degenerate closed quadric surface having curved and opposing end points. In a further embodiment, the overall shape can be that of a capsule (e.g., an ideal or mathematically defined capsule). The overall shape can further be that of a sphere or an ellipsoid. When noting the overall shape, some deviations from an ideal shape (mathematically) are expected for reasons of functionality (of the optical characteristics) for manufacturing efficiency, for challenges with electronic component placement, and for aesthetic reasons. For example, a slight offset from a mathematically defined outer shape can exist at a join between a center portion (of a three part sectional body) to either make it easier to join the sections, or to provide greater interior space for placing circuit boards, a battery, a processor, or other components. As shown by FIG. 9, a bottom portion of the body's shape can be flattened to be able to sit stably on a horizontal or flat surface. A top button (1010 of FIG. 8) and even an access port (1020, 1060) are expected deviations of an outer surface from an "idealized" shape, as is known or expected by one of ordinary skill. Nonetheless, in a further embodiment, the idealized shape is recognizable as an ellipsoid or sphere (see FIGS. 1-3) making this shape approximately that of an ellipsoid or sphere in contemplated embodiments. For quantification purposes, some standard deviations from an overall shape, as defined herein, are within a ten percent deviation by surface area of an idealized shape, within a five percent deviation of a cross sectional idealized curvature, and the like. These deviations are consistent with industry standards and expectations of those of ordinary skill in the art in context of device design.

Referring back to the drawings FIGS. 4-9 are all views of the device shown in FIG. 1. Other shapes are various embodiments, as previously noted, and FIGS. 4-9 illustrate by example a number of expected components understood to be applicable to embodiments represented by FIGS. 2, 3, and the like.

Figure 4:
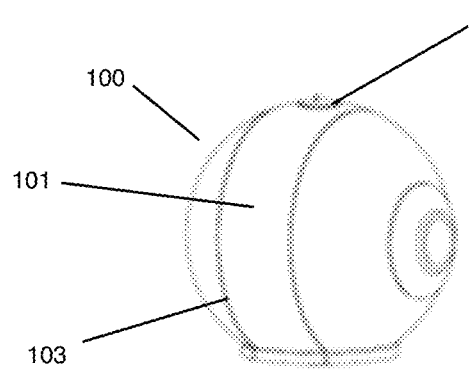
FIG. 4 is a perspective view of the panoramic optical device showing button in accordance with embodiments of the disclosure.
Figure 5:
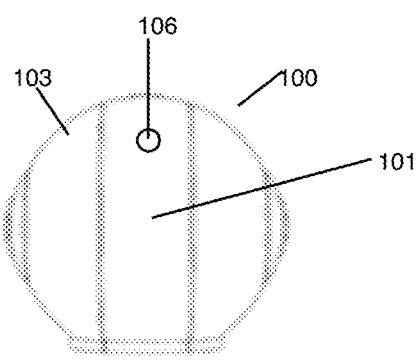
FIG. 5 shows a side view of the panoramic optical device in accordance with embodiments of the disclosure.
Figure 6:
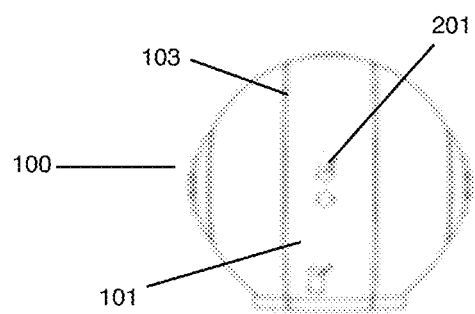
FIG. 6 shows an opposing side view with a couple openings for ventilation/sound/optical in accordance with embodiments of the disclosure.

FIG. 4 is a perspective view of the panoramic optical device showing button 610, which can be used to turn the device on/off. FIG. 4 of the device further shows a housing 100 with an exterior surface 101, and an outer shell 103. FIG. 5 shows a side view of the device with a housing 100 with an exterior surface 101, an outer shell 103, and a first opening 106. FIG. 6 shows an opposing side view with a housing 100 with an exterior surface 101, and an outer shell 103, and an air duct 201.

Figure 7:
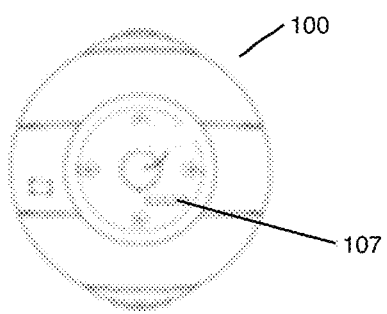
FIG. 7 shows a bottom view of the device in accordance with embodiments of the disclosure.
Figure 8:
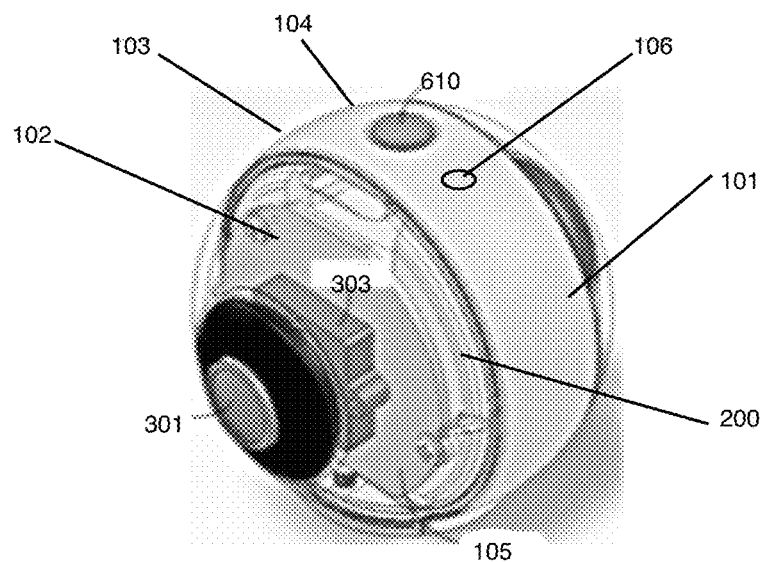
FIGS. 8 and 9 show views of the panoramic optical device with transparent sides to show the internal components in accordance with embodiments of the disclosure.
Figure 9:
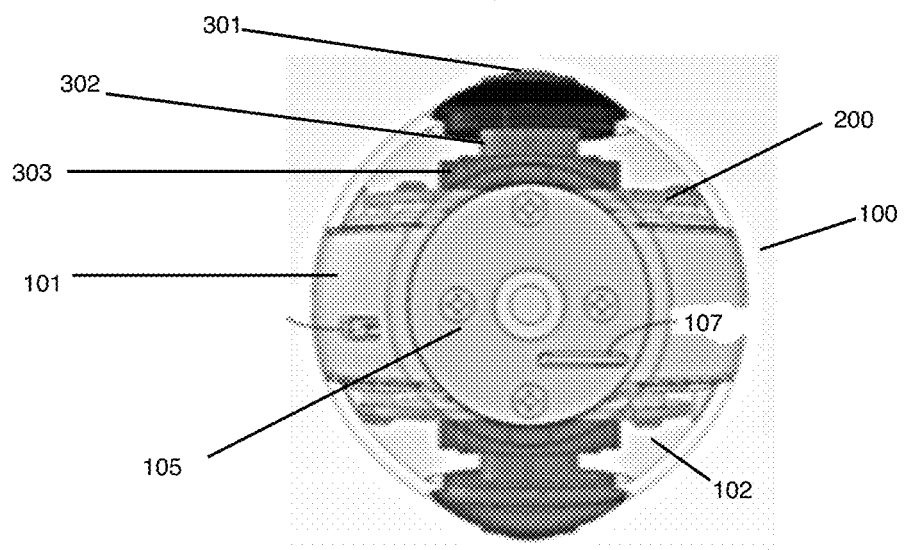

FIG. 7 shows a bottom view a housing 100, and second opening 107 FIGS. 8 and 9 show the panoramic optical device with transparent sides to show the internal components. In these figures, a housing 100, exterior surface 101, an internal space 102, an outer shell 103, top end 104 and bottom end 105 of the outer shell, first opening 106, a second opening 107, a chassis 200, lens 301, a sensor 302, and processor 303 are shown.

FIGS. 4-9 depicts a recording device 1 having a cooling system, and the cooling system comprises: a housing 100 with an exterior surface 101 and an internal space 102, the exterior surface 101 forming an outer shell 103 of the device, the outer shell 103 having top 104 and bottom ends 105, the internal space 102 is designed to contain components of the device; and at least one chassis 200, at least a portion of the chassis 200 is enclosed by the outer shell 103 and is situated within at least a portion of the internal space 102 of the housing; when the device is in use, the components of the device create heat, and the chassis 200 absorbs the heat and creates a convention effect which draws cool air from the bottom end 105 of the outer shell 103, the drawing of cool air creates airflow throughout the internal space 102 thereby cooling the device 1 and its components, and preventing overheating of the device 1.

The chassis 200 conducts heat away from the components of the device 1 allowing the device 1 to maintain a constant optimal internal operating temperature. The device 1 comprises following components: lens 301, sensor 302, and processor 303.

The outer shell 103 comprises at least two openings, a first opening 106 at the top end 104 and a second opening 107 at the bottom end 105 of the outer shell 103. The outer shell 103 comprises at least two openings, a first opening 106 at the top end 104 and a second opening 107 at the bottom end 105 of the outer shell 103. The chassis 200 comprises at least one air duct 201.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Numerous modifications and variations of the present invention are possible in light of the above teachings. It is therefore to be understood that within the scope of the attendant claims attached hereto, this invention may be practiced otherwise than as specifically disclosed herein.

What is claimed is:

1. A recording device having a cooling system, said cooling system comprises:
   a housing comprising an exterior surface and a single internal space, said exterior surface forming an outer shell of said device, said outer shell having top and bottom ends, said internal space is designed to contain components of said device, said outer shell comprises at least one opening, said components of said device being situated adjacent to said opening of said shell;
   a chassis that is a solid structure, at least a portion of said chassis is enclosed by said outer shell and is situated within at least a portion of said internal space of said housing, wherein said chassis comprises a surface area, said surface area of said chassis has multi-level surfaces creating ridges and gaps which create a maximum amount of said surface area to allow said chassis to conduct a maximum amount of heat away from said components of said device allowing said device to maintain a constant optimal internal operating temperature;
   when said device is in use, the components of said device create heat, said chassis absorbs the heat creating a convection effect which draws cool air from said bottom end of said outer shell and said cool air pushes out hot air in said device allowing cool external air to flow directly over said components of said device throughout said internal space thereby cooling said device and its components; and
   a recording device has an optimal internal environment that allows said device to be capable of continuously recording twenty four hours a day.

2. The system of claim 1 wherein said device is a camera.

3. The system of claim 1 wherein said device is a 360 degree camera.

4. The system of claim 1 wherein said device is a video, audio and infrared recording and playing device.

5. The system of claim 4, wherein said device is capable of continuously recording audio, video, photos, and infrared in all types of light.

6. The system of claim 1 wherein said device comprises components, said components are selected from a group comprising lens, sensors, and processors.

7. The system of claim 5 wherein said devices comprises at least two lenses, at least one sensor and at least one processor.

8. The system of claim 1 wherein said chassis comprises a surface area, said surface area of said chassis has multi-level surfaces creating ridges and gaps which create a maximum amount of said surface area, the maximum amount of said surface area allow said chassis to absorb a maximum amount of heat.

9. The system of claim 1 wherein said outer shell comprises at least two openings, a first opening at said top end and a second opening at said bottom end of said outer shell.

10. The system of claim 8 wherein said chassis is situated adjacent said second opening at said bottom end of said outer shell of said device.

11. The system of claim 9 wherein said chassis comprises at least one air duct.

12. The system of claim 10 wherein said chassis creates the convention effect which draws cool air through said second opening at said bottom end of said outer shell and said air ducts of said chassis.

13. The system of claim 11 wherein the drawing of cool air creates airflow through said bottom end of said outer shell and said air ducts of said chassis, and causes hot air to exit through said first opening at said top end of said outer shell.

14. The system of claim 1 wherein said chassis of said device uses radiation to dissipate heat.

15. The system of claim 1 wherein said device has a base attachment which further conducts heat away from said components of said device allowing for increased heat management.

16. A camera device having a cooling system, said camera comprises:
  components comprising at least two lenses, at least one sensor and at least one processor;
  a housing comprising an exterior surface and a single internal space, said exterior surface forming an outer shell of said device, said internal space is designed to contain said lenses, said sensor and said processor of said device, said outer shell comprises at least one opening and at least one vent, said components of said device being situated adjacent to said opening of said outer shell;
  a solid construction chassis, at least a portion of said chassis is enclosed by said outer shell and is situated within at least a portion of said internal space of said housing wherein said chassis has a surface area that has multi-level surfaces creating ridges and gaps which create a maximum amount of said surface area, the maximum amount of said surface area allows said chassis to conduct maximum amount of heat away from said components;
  when said device is in use, the components of said device create heat, said chassis absorbs the heat creating a convention effect which draws cool air through said opening of said outer shell and said cool air pushes out hot air out of said vent allowing cool external air to flow directly over said components of said device thereby cooling said device and preventing overheating of said device and allowing said device to maintain a constant optimal internal operating temperature; and
  said recording device has an optimal internal environment that allows said device to be capable of continuously recording twenty four hours a day.

17. The system of claim 16 wherein said device is a 360 degree camera.

18. The system of claim 16 wherein said device is a video, audio and infrared recording device.

19. The system of claim 16 wherein said chassis comprises a surface area, said surface area of said chassis has multi-level surfaces creating ridges and gaps which create a maximum amount of said surface area, the maximum amount of said surface area allow said chassis to absorb a maximum amount of heat.

20. The system of claim 16 wherein said chassis is situated adjacent said opening at said bottom end of said outer shell of said device.

21. The system of claim 16 said chassis comprises at least one air duct, said chassis creates the convention effect which draws cool air through said air ducts.

22. A method of cooling a recording device, said method comprising:
  providing a housing comprising an exterior surface and a single internal space, said exterior surface forming an outer shell of said device, said outer shell having top and bottom ends, said internal space is designed to contain components of said device, said outer shell having air ducts;
  providing at least one solid structure chassis, at least a portion of said chassis is enclosed by said outer shell and is situated within at least a portion of said internal space of said housing wherein said chassis comprises a surface area that has multi-level surfaces creating ridges and gaps which create a maximum amount of said surface area that allows said chassis to conduct a maximum amount of heat away from said components;
  when said device is in use, the components of said device create heat, said chassis absorbs the heat creating a convention effect which draws cool air through said air ducts at the bottom of said chassis, the drawing of cool air creates airflow, and pushes hot air out to exit through said air ducts at the top of said chassis thereby cooling said device and its components, and allowing cool external air to flow directly over said components; and
  said recording device has an optimal internal environment that allows said device to be capable of continuously recording twenty four hours a day.

23. The method of claim 22 wherein said device is a 360 camera and said device comprises components, said components comprise at least two lenses, at least one sensor and at least one processor.

* * * * *